US008847183B2

(12) United States Patent
Partlo et al.

(10) Patent No.: US 8,847,183 B2
(45) Date of Patent: Sep. 30, 2014

(54) SYSTEM, METHOD AND APPARATUS FOR LASER PRODUCED PLASMA EXTREME ULTRAVIOLET CHAMBER WITH HOT WALLS AND COLD COLLECTOR MIRROR

(71) Applicant: Cymer, LLC, San Diego, CA (US)

(72) Inventors: William N. Partlo, Poway, CA (US); Igor V. Fomenkov, San Diego, CA (US)

(73) Assignee: ASML Netherlands B. V., Veldhoven (NL)

( * ) Notice: Subject to any disclaimer, the term of this patent is extended or adjusted under 35 U.S.C. 154(b) by 0 days.

(21) Appl. No.: 14/061,087

(22) Filed: Oct. 23, 2013

(65) Prior Publication Data

US 2014/0048099 A1 Feb. 20, 2014

Related U.S. Application Data

(63) Continuation of application No. 12/725,167, filed on Mar. 16, 2010, now Pat. No. 8,575,575.

(60) Provisional application No. 61/168,033, filed on Apr. 9, 2009, provisional application No. 61/168,012, filed on Apr. 9, 2009, provisional application No. 61/168,000, filed on Apr. 9, 2009.

(51) Int. Cl.
*H05G 2/00* (2006.01)
*G21K 5/00* (2006.01)
*G03F 7/20* (2006.01)

(52) U.S. Cl.
CPC ................ *G21K 5/00* (2013.01); *H05G 2/005* (2013.01); *G03F 7/70033* (2013.01); *H05G 2/003* (2013.01); *H05G 2/006* (2013.01)
USPC ..................................................... 250/504 R

(58) Field of Classification Search
USPC ..................................................... 250/504 R
See application file for complete search history.

(56) References Cited

U.S. PATENT DOCUMENTS

| 6,781,135 | B2 | 8/2004 | Berger |
| 6,998,620 | B2 | 2/2006 | Schriever |
| 7,088,424 | B2 | 8/2006 | Bakker et al. |
| 7,372,056 | B2 | 5/2008 | Bykanov et al. |
| 7,880,153 | B2 | 2/2011 | Suganuma et al. |
| 2006/0114956 | A1 | 6/2006 | Sandstrom et al. |
| 2006/0139604 | A1 | 6/2006 | Wassink et al. |
| 2006/0163500 | A1* | 7/2006 | Inoue et al. ................ 250/493.1 |
| 2006/0175558 | A1* | 8/2006 | Bakker et al. .............. 250/492.2 |

(Continued)

FOREIGN PATENT DOCUMENTS

| JP | 2007258069 | 4/2007 |
| JP | 2008226462 | 9/2008 |

OTHER PUBLICATIONS

Intl Search report—PCT/US2010/029441—dated Jul. 27, 2010.

*Primary Examiner* — Nicole Ippolito
*Assistant Examiner* — Eliza Osenbaugh-Stewar
(74) *Attorney, Agent, or Firm* — Martine Penilla Group, LLP

(57) ABSTRACT

A system and method for an extreme ultraviolet light chamber comprising a collector mirror, a cooling system coupled to a backside of the collector mirror operative to cool a reflective surface of the collector mirror and a buffer gas source coupled to the extreme ultraviolet light chamber.

19 Claims, 14 Drawing Sheets

(56) References Cited

U.S. PATENT DOCUMENTS

| | | |
|---|---|---|
| 2007/0018119 A1* | 1/2007 | Yabuta et al. ............. 250/493.1 |
| 2007/0069162 A1 | 3/2007 | Banine et al. |
| 2007/0170377 A1 | 7/2007 | Nakano |
| 2008/0017801 A1 | 1/2008 | Fomenkov et al. |
| 2008/0035865 A1 | 2/2008 | Komori et al. |
| 2008/0104828 A1 | 5/2008 | Someya et al. |
| 2008/0304028 A1 | 12/2008 | Wassink |
| 2011/0048452 A1 | 3/2011 | Zink et al. |

* cited by examiner

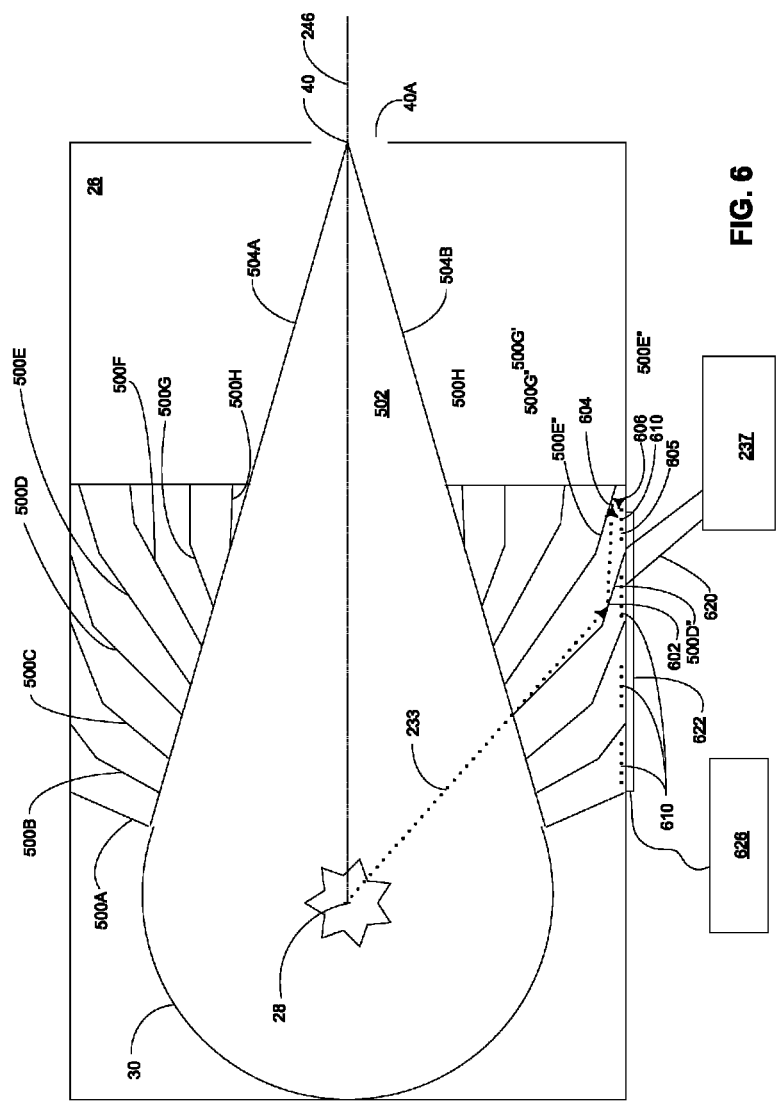

SYSTEM, METHOD AND APPARATUS FOR LASER PRODUCED PLASMA EXTREME ULTRAVIOLET CHAMBER WITH HOT WALLS AND COLD COLLECTOR MIRROR

CROSS REFERENCE TO RELATED APPLICATIONS

This application is a continuation of and claims priority from U.S. patent application Ser. No. 12/725,167 filed on Mar. 16, 2010 and entitled "System, Method and Apparatus for Laser Produced Plasma Extreme Ultraviolet Chamber with Hot Walls and Cold Collector Mirror," which is incorporated herein by reference in its entirety. This application also claims priority through application Ser. No. 12/725,167 from U.S. Provisional Patent Application No. 61/168,033 filed on Apr. 9, 2009 and entitled "Extreme Ultraviolet Light Output," which is incorporated herein by reference in its entirety for all purposes. This application also claims priority through application Ser. No. 12/725,167 from U.S. Provisional Patent Application No. 61/168,012 filed on Apr. 9, 2009 and entitled "System, Method and Apparatus for Laser Produced Plasma Extreme Ultraviolet Chamber with Hot Walls and Cold Collector Mirror," which is incorporated herein by reference in its entirety for all purposes. This application also claims priority through application Ser. No. 12/725,167 from U.S. Provisional Patent Application No. 61/168,000 filed on Apr. 9, 2009 and entitled "System, Method and Apparatus for Droplet Catcher for Prevention of Backsplash in a EUV Generation Chamber," which is incorporated herein by reference in its entirety for all purposes.

BACKGROUND

The present invention relates generally to laser produced plasma extreme ultraviolet systems, methods and apparatus, and more particularly, to systems, methods and apparatus for droplet management in a laser produced plasma extreme ultraviolet system.

Laser produced plasma (LPP) extreme ultraviolet (EUV) systems produce a plasma by irradiating a droplet of a plasma target material with a source laser. The resulting plasma emits light at a desired wavelength, in this instance, EUV (e.g., less than about 50 nm wavelength and including light at a wavelength of about 13.5 nm or less).

Unfortunately irradiating the droplet of the plasma target material can result in debris from the droplet. The debris can be deposited on the collector mirror and other inner surfaces of the EUV chamber. The debris deposited on the collector mirror can reduce the amount of EUV light output.

Further, some of the droplets of the target material are not irradiated by the source laser and as a result may produce splashes and other micro-particles and debris that can become deposited on the inner surfaces of the LPP chamber.

In view of the foregoing, there is a need for providing better control of the micro-particles and debris generated during the process of operating in a LPP EUV chamber.

SUMMARY

Broadly speaking, the present invention fills these needs by providing an improved EUV light chamber in an LPP EUV system. It should be appreciated that the present invention can be implemented in numerous ways, including as a process, an apparatus, a system, computer readable media, or a device. Several inventive embodiments of the present invention are described below.

One embodiment provides an extreme ultraviolet light chamber comprising a collector, a cooling system coupled to a backside of the collector operative to cool a reflective surface of the collector and a buffer gas source coupled to the extreme ultraviolet light chamber.

The chamber can also include a target material condenser system coupled to the extreme ultraviolet light chamber. The chamber can also include multiple baffles located between the collector and an output of the extreme ultraviolet light chamber. The chamber can also include a heat source coupled to at least a portion of the baffles. The heat source can be capable of heating at least a portion of the baffles to a temperature greater than the reflective surface of the collector. The heat source can be capable of heating at least a portion of the baffles to a melting temperature of a target material.

At least a first portion of each one of the baffles can be substantially aligned to an irradiation region. At least a second portion of at least one of the baffles is substantially not aligned to the irradiation region. The baffles can begin at an edge of a transmissive region and the baffles extend to an inner surface of the extreme ultraviolet light chamber. Each one of the baffles is separated from an adjacent baffle by a corresponding space. Each one of the corresponding spaces between the adjacent baffles can have an equal width or a different width.

The chamber can also include a target material condenser system coupled to the extreme ultraviolet light chamber. The target material condenser system can include a vacuum source coupled to the extreme ultraviolet light chamber.

Another embodiment provides an extreme ultraviolet light chamber including a collector and multiple baffles located between the collector and an output of the extreme ultraviolet light chamber. At least a first portion of each one of the baffles is substantially aligned to an irradiation region and at least a second portion of at least one of the plurality of baffles is substantially not aligned to the irradiation region.

Another embodiment provides a method of generating an extreme ultraviolet light including outputting droplets of target material from a droplet generator in an extreme ultraviolet laser chamber, focusing a source laser on a selected one of the droplets in an irradiation region, irradiating the selected one of the droplets, collecting an extreme ultraviolet light emitted from the irradiated droplet in a collector, a reflective surface of the collector is cooled, a target material residue is deposited on the reflective surface of the collector, the target material residue being emitted from the irradiated droplet, a hydrogen containing gas is injected into the extreme ultraviolet laser chamber and a first quantity of target material residue on the reflective surface of the collector is converted to a hydride and the hydride of the first quantity of target material residue is evaporated from the reflective surface of the collector, the evaporated hydride of the first quantity of target material residue is removed from the extreme ultraviolet laser chamber.

The method can also include collecting a second quantity of target material residue on a set of baffles located between the collector and an output of the extreme ultraviolet laser chamber. The method can also include heating at least a portion of the baffles to a melting temperature of the target material residue. The liquefied target material residue can be captured in a target material condenser system.

The method can also include heating non-critical inner surfaces of the extreme ultraviolet laser chamber to a temperature greater than the temperature of the reflective surface of the collector. The non-critical inner surfaces of the extreme ultraviolet laser chamber include surfaces other than the collector. Removing the evaporated hydride of the first quantity of target material residue from the extreme ultraviolet laser chamber can include decomposing the evaporated hydride on the heated non-critical inner surfaces of the extreme ultraviolet laser chamber.

The method can also include heating non-critical inner surfaces of the extreme ultraviolet laser chamber to a temperature equal to or greater than a melting temperature of the target material residue. The liquefied target material residue can be captured in a target material condenser system.

Still another embodiment provides a method of generating an extreme ultraviolet light including outputting droplets of target material from a droplet generator in an extreme ultraviolet laser chamber, focusing a source laser on a selected one of the plurality of droplets in an irradiation region, irradiating the selected one of the plurality of droplets, collecting an extreme ultraviolet light emitted from the irradiated droplet in a collector and collecting a quantity of target material residue on a set of baffles located between the collector and an output of the extreme ultraviolet laser chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 6 illustrates a mid vessel baffle assembly in an EUV chamber, in accordance with an embodiment of the disclosed subject matter.

DETAILED DESCRIPTION

Several exemplary embodiments for an improved catch system and method for capturing the unused droplets in an LPP EUV system will now be described. It will be apparent to those skilled in the art that the present invention may be practiced without some or all of the specific details set forth herein.

One LPP technique involves generating a stream of target material droplets and irradiating some or all of the droplets with light pulses, e.g. zero, one or more pre-pulse(s) followed by a main pulse. In more theoretical terms, LPP light sources generate EUV radiation by depositing light or laser energy into a target material having at least one EUV emitting element (e.g., xenon (Xe), tin (Sn) or lithium (Li)), creating a highly ionized plasma with electron temperatures of several 10's of eV. The energetic radiation generated during de-excitation and recombination of these ions is emitted from the plasma in all directions.

A near-normal-incidence mirror (a "collector mirror") is positioned at a relatively short distance (e.g., 10-50 cm) from the plasma to collect, direct and focus the EUV light to an intermediate location or focal point. The collected EUV light can then be relayed from the intermediate location to a set of scanner optics and ultimately to a target, such as a semiconductor wafer, in a photolithography process.

The collector mirror includes a delicate and relatively expensive multi-layer coating to efficiently reflect EUV light. Keeping the surface of the collector mirror relatively clean and protecting the surface from unwanted plasma-generated debris is a challenge facing the EUV light source developers.

In an exemplary arrangement that is currently being developed with the goal of producing about 100 W at the intermediate location. A pulsed, focused 10-12 kW $CO_2$ drive laser (or suitable other laser such as an excimer laser) is synchronized with a droplet generator to sequentially irradiate about 10,000-200,000 tin droplets per second. This arrangement needs to produce a stable stream of droplets at a relatively high repetition rate (e.g., 10-200 kHz or more) and deliver the droplets to an irradiation site with high accuracy and good repeatability in terms of timing and position over relatively long periods of time.

Figure 1:
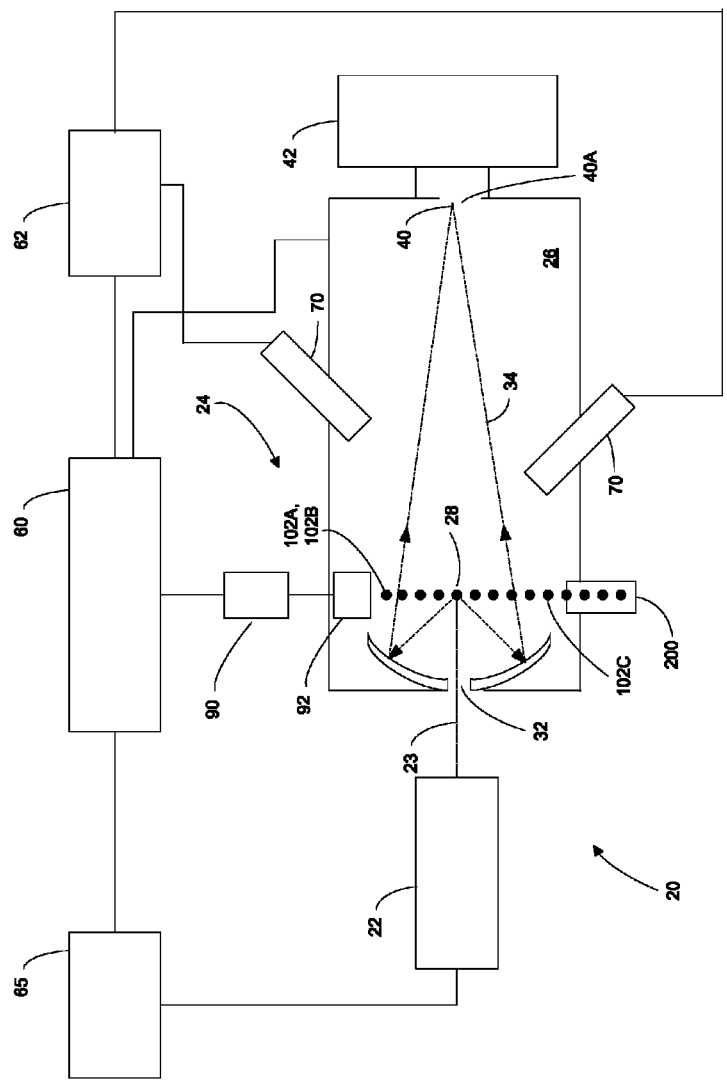
FIG. 1 is a schematic view of a laser-produced-plasma EUV light source, in accordance with embodiments of the disclosed subject matter.

FIG. 1 is a schematic view of a laser-produced-plasma EUV light source 20, in accordance with embodiments of the disclosed subject matter. The LPP light source 20 includes a light pulse generation system 22 for generating a train of light pulses and delivering the light pulses into an EUV chamber 26. Each light pulse 23 travels along a beam path from the light pulse generation system 22 and into the EUV chamber 26 to illuminate a respective target droplet at an irradiation region 28.

Suitable lasers for use in the light pulse generation system 22 shown in FIG. 1, may include a pulsed laser device, e.g., a pulsed gas discharge $CO_2$ laser device producing radiation at about 9.3 µm or about 10.6 µm, e.g., with DC or RF excitation, operating at relatively high power, e.g., about 10 kW or higher and high pulse repetition rate, e.g., about 50 kHz or more. In one particular implementation, the laser in the light pulse generation system 22 may be an axial-flow RF-pumped $CO_2$ laser having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, and focused before reaching the irradiation region 28.

Continuously pumped $CO_2$ amplifiers may be used for the light pulse generation system 22. For example, a suitable $CO_2$ laser device having an oscillator and three amplifiers (O-PA1-PA2-PA3 configuration) is disclosed in co-owned U.S. Pat. No. 7,439,530, issued on Oct. 21, 2008, entitled, LPP EUV LIGHT SOURCE DRIVE LASER SYSTEM, the entire contents of which are hereby incorporated by reference herein.

Alternatively, the laser in the light pulse generation system 22 may be configured as a so-called "self-targeting" laser system in which the droplet serves as one mirror of the optical cavity. In some "self-targeting" arrangements, a master oscillator may not be required. Self targeting laser systems are disclosed and claimed in co-owned U.S. Pat. No. 7,491,954, issued on Feb. 17, 2009, entitled, DRIVE LASER DELIVERY SYSTEMS FOR EUV LIGHT SOURCE, the entire contents of which are hereby incorporated by reference herein.

Depending on the application, other types of lasers may also be suitable for use in the light pulse generation system 22, e.g., an excimer or molecular fluorine laser operating at high power and high pulse repetition rate. Other examples include, a solid state laser, e.g., having a fiber, rod or disk shaped active media, a MOPA configured excimer laser system, e.g., as shown in U.S. Pat. Nos. 6,625,191, 6,549,551, and 6,567,450, the entire contents of which are hereby incorporated by reference herein, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers, may be suitable. Other designs are possible.

Referring again to FIG. 1, the EUV light source 20 may also include a target material delivery system 24, e.g., delivering droplets of a target material into the interior of a chamber 26 to the irradiation region 28, where the droplets 102A, 102B will interact with one or more light pulses 23, e.g., one or more pre-pulses and thereafter one or more main pulses, to ultimately produce a plasma and generate an EUV emission 34. The EUV chamber 26 is maintained at a near vacuum (e.g., between about 50 mT and 1500 mT) for the plasma formation. The target material may include, but is not necessarily limited to, a material that includes tin, lithium, xenon, etc., or combinations thereof. The EUV emitting element, e.g., tin, lithium, xenon, etc., may be in the form of liquid droplets and/or solid particles contained within liquid droplets 102A, 102B.

By way of example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in co-owned U.S. Pat. No. 7,465,946, issued Dec. 18, 2008, entitled ALTERNATIVE FUELS FOR EUV LIGHT SOURCE, the contents of which are hereby incorporated by reference herein.

Referring further to FIG. 1, the EUV light source 20 includes a collector mirror 30. The collector mirror 30 is a near-normal incidence collector mirror having a reflective surface in the form of a prolate spheroid (i.e., an ellipse rotated about its major axis). The actual shape and geometry can of course change depending on the size of the chamber and the location of focus. The collector mirror 30 can include a graded multi-layer coating in one or more embodiments. The graded multi-layer coating can include alternating layers of Molybdenum and Silicon, and in some cases one or more high temperature diffusion barrier layers, smoothing layers, capping layers and/or etch stop layers.

The collector mirror 30 also includes an aperture 32. The aperture 32 allows the light pulses 23 generated by the light pulse generation system 22 to pass through to the irradiation region 28. The collector mirror 30 can be a prolate spheroid mirror that has a first focus within or near the irradiation region 28 and a second focus at an intermediate region 40. The EUV light 34 is output at or near the intermediate region 40 from the EUV light source 20 and input to a device 42 utilizing EUV light 34. By way of example, the device 42 that receives the EUV light 34 can be an integrated circuit lithography tool.

It is to be appreciated that other optics may be used in place of the prolate spheroid mirror 30 for collecting and directing EUV light 34 to an intermediate location for subsequent delivery to a device utilizing the EUV light. By way of example the collector mirror 30 can be a parabola rotated about its major axis. Alternatively, the collector mirror 30 can be configured to deliver a beam having a ring-shaped cross-section to the intermediate location 40 (e.g., co-pending U.S. patent application Ser. No. 11/505,177, filed on Aug. 16, 2006, entitled EUV OPTICS, the contents of which are hereby incorporated by reference).

The EUV light source 20 may also include an EUV controller 60. The EUV controller 60 can include a firing control system 65 for triggering one or more lamps and/or laser devices in the light pulse generation system 22 to thereby generate light pulses 23 for delivery into the chamber 26.

The EUV light source 20 may also include a droplet position detection system including one or more droplet imagers 70. The droplet imagers 70 can capture images using CCD's or other imaging technologies and/or backlight stroboscopic illumination and/or light curtains that provide an output indicative of the position and/or timing of one or more droplets 102A, 102B relative to the irradiation region 28. The imagers 70 are coupled to and output the droplet location and timing data to a droplet position detection feedback system 62. The droplet position detection feedback system 62 can compute a droplet position and trajectory, from which a droplet error can be computed. The droplet error can be calculated on a droplet by droplet basis or on average droplet data. The droplet position error may then be provided as an input to the EUV controller 60. The EUV controller 60 can provide a position, direction and/or timing correction signal to the light pulse generation system 22 to control a source timing circuit and/or to control a beam position and shaping system to change the trajectory and/or focal power or focal point of the light pulses being delivered to the irradiation region 28 in the chamber 26.

The EUV light source 20 can also include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

The EUV light source 20 can also include a droplet control system 90, operable in response to a signal (which in some implementations may include the droplet error described above, or some quantity derived therefrom) from the EUV controller 60, to e.g., modify the release point of the target material from a target material dispenser 92 and/or modify droplet formation timing, to correct for errors in the droplets 102A, 102B arriving at the desired irradiation region 28 and/or synchronize the generation of droplets 102A, 102B with the light pulse generation system 22.

Figure 2A:
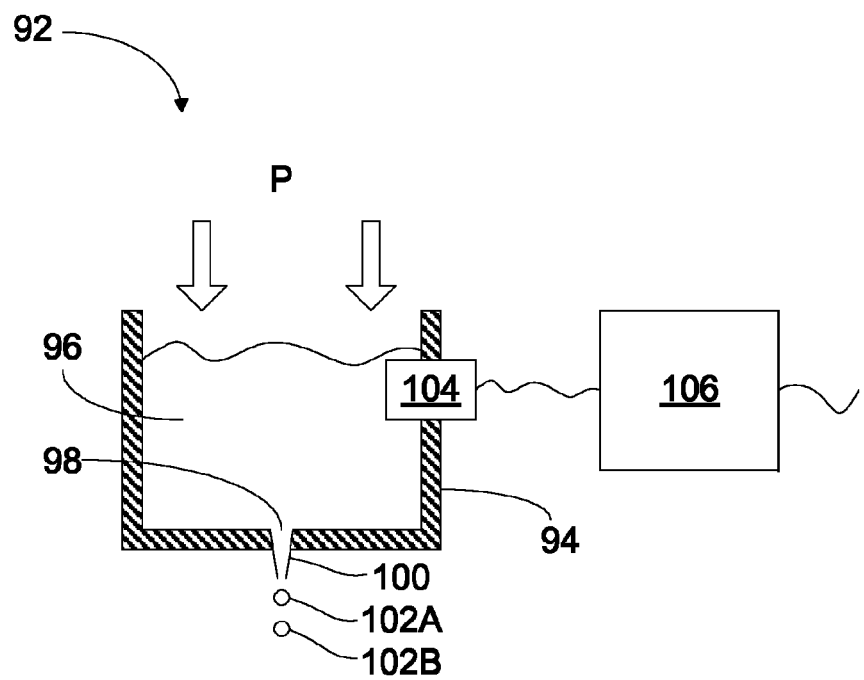
FIG. 2A is a schematic of the components of a simplified target material dispenser that may be used in some or all of the embodiments described herein in accordance with embodiments of the disclosed subject matter.

FIG. 2A is a schematic of the components of a simplified target material dispenser 92 that may be used in some or all of the embodiments described herein in accordance with embodiments of the disclosed subject matter. The target material dispenser 92 includes a conduit or reservoir 94 holding a fluid form of the target material 96. The fluid target material 96 can be a liquid such as a molten metal (e.g., molten tin), under a pressure, P. The reservoir 94 includes an orifice 98 allowing the pressurized fluid target material 96 to flow through the orifice 98 establishing a continuous stream 100. The continuous stream 100 subsequently breaks into a stream of droplets 102A, 102B. The target material dispenser 92 further includes a sub-system producing a disturbance in the fluid having an electro-actuatable element 104 that is operable, coupled with the fluid target material 96 and/or the orifice 98 and a signal generator 106 driving the electro-actuatable element 104.

More details regarding various droplet dispenser configurations and their relative advantages may be found in co-pending U.S. patent application Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE; co-pending U.S. patent application Ser. No. 11/358,988, filed on Feb. 21, 2006, entitled LASER PRODUCED PLASMA EUV LIGHT SOURCE WITH PRE-PULSE; co-owned U.S. Pat. No. 7,405,416, issued Jul. 29, 2008, entitled METHOD AND APPARATUS FOR EUV PLASMA SOURCE TARGET DELIVERY; and co-owned U.S. Pat. No. 7,372,056, issued on May 13, 2008, entitled LPP EUV PLASMA SOURCE MATERIAL TARGET DELIVERY SYSTEM; the contents of each of which are hereby incorporated by reference.

The droplets 102A, 102B are between about 20 and about 100 μm in diameter. The droplets 102A, 102B are produced by pressurizing target material 96 through the orifice 98. By way of example, the orifice 98 can have a diameter of less than about 50 μm in one embodiment. The droplets 102A, 102B are launched at a velocity of about 30 to 70 m/s. Due to the high velocity of the droplets 102A, 102B, the droplet stay on the nearly straight droplet path 209 and do not impinge on the collector mirror 30, whether the droplets stream is produced in horizontal, vertical, or some other orientation. In one embodiment, not all the droplets 102A, 102B produced by the target material dispenser 92 in continuous mode are used for plasma generation. If the EUV source works with a duty cycle of less than 100% a portion of the droplets 102c will pass the irradiation region 28 and can be collected thereafter. If the unused droplets 102c are allowed to impact the opposite wall of the EUV source chamber they will produce a large amount of fast moving fragments with broad spatial distribution. Significant portions of these fragments 231 will be deposited on the EUV collector mirror 30 and diagnostic ports and devices 70, thus affecting their performance.

Another source of the debris is the irradiation region 28. When irradiated with intense light pulses the droplets 102A, 102B are heated on one side that results in rapid asymmetric material expansion and EUV light emissions 230. As described above the EUV light emissions 230 are collected in the collector mirror 30. As a result of the expansion a significant amount of droplet material is accelerated in the direction away from the light pulse 23 with velocities comparable to the velocity of the droplets 102A, 102B as they are output from the target material dispenser 92. This material is traveling away from the irradiation region 28 until it strikes some surface, at which point it can be reflected or backsplashed in various directions. The backsplashed target material 231 may be deposited on the collector mirror 30.

Figure 2B:
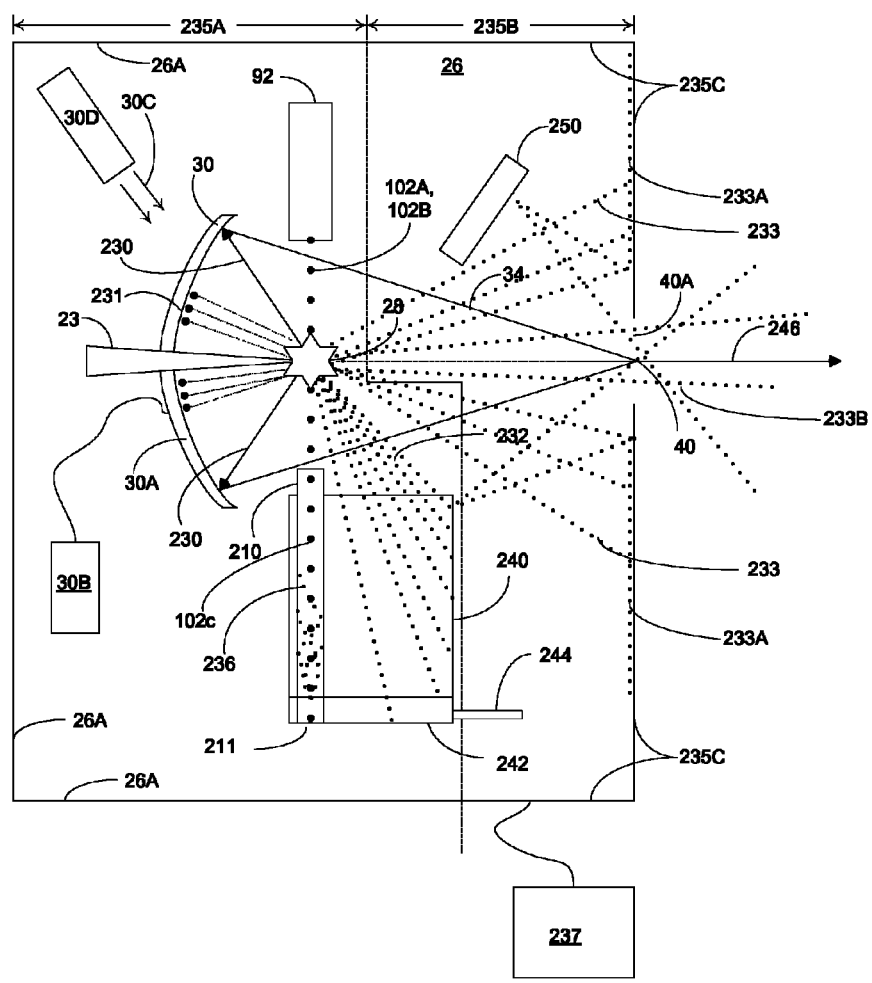
FIGS. 2B and 2C are more detailed schematics of some of the components in a EUV chamber in accordance with embodiments of the disclosed subject matter.
Figure 2C:
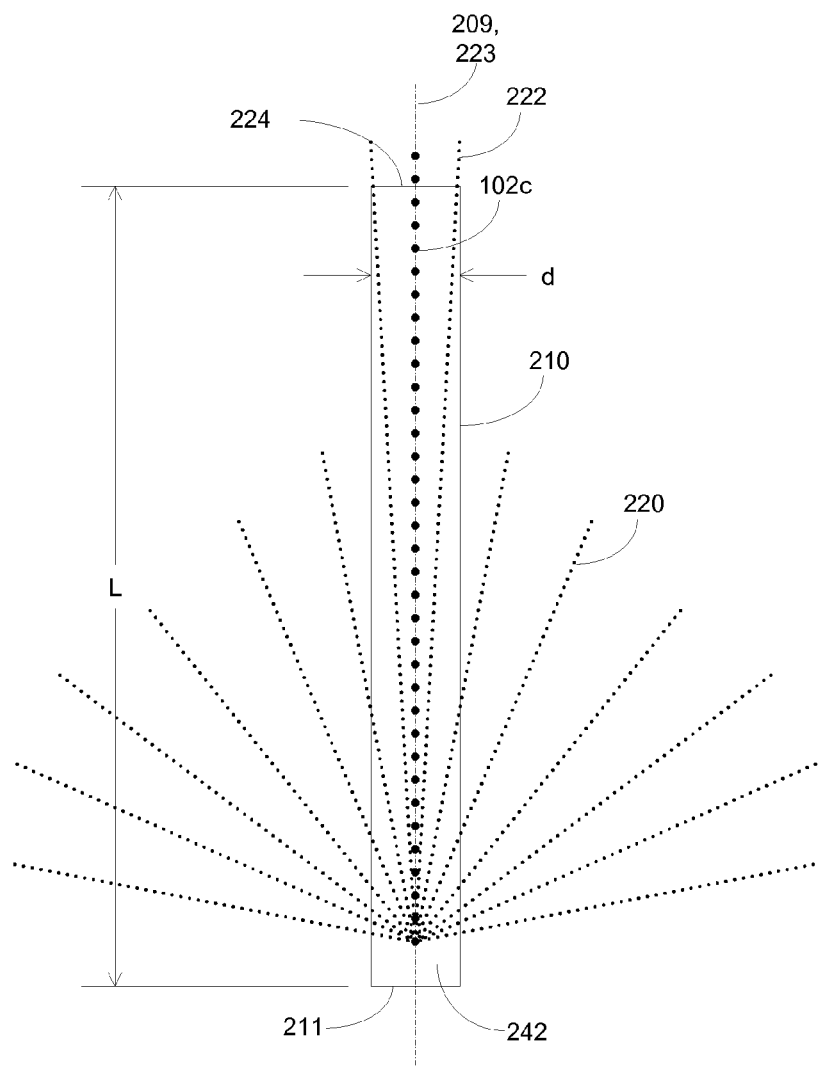

FIGS. 2B and 2C are more detailed schematics of some of the components in a EUV chamber in accordance with embodiments of the disclosed subject matter. As described above, the target material dispenser 92 outputs a stream of droplets 102A, 102B, however, not all of the droplets are irradiated (i.e., used) to generate the EUV 34. By way of example unused droplets 102C are not irradiated by the incoming light pulses 23.

The unused droplets 102C are captured in a first catch 210 so as to minimize any backsplash of the unused droplets within the EUV chamber 26. The backsplash 236 can be in the form of microparticles or liquid droplets. The unused droplets 102C strike the bottom 211 of the first catch 210. Microparticles 236 can reflect multiple times from the bottom and off the walls of first catch 210 and a portion of the micro particles 222, as shown in FIG. 2C, can escape back into the EUV chamber 26 and a portion of the microparticles 231 can deposit on various surface such as on the collector mirror 30. Microparticles 220 are shown in phantom to illustrate some of the backsplash of microparticles that are captured or prevented by the catch 210.

The first catch 210 can be an elongated tube having a cross section that can be circular, oblong, oval, rectangular, square, or any other suitable shape. As shown in FIG. 2C, the first catch 210 includes an open end 224 oriented toward the target material dispenser 92. The open end 224 can be substantially centered on the droplet path 209. The first catch 210 also includes a centerline 223 that may or may not be aligned to the droplet path 209 as will be described in more detail below.

The backsplash can be reduced or minimized by using a first catch 210 having a relatively large aspect ratio L/W, e.g. greater than about 3 and preferably greater than about 8, where L is the first catch length and W is the largest inside dimension normal to L, of the first catch. Upon striking the inner wall of the first catch 210, the unused droplets 102c reduce their velocity and the unused droplets can be captured in the first catch, as shown.

As shown in FIG. 2B, the irradiated droplets can also produce microparticles 232 after being irradiated. The microparticles 232 can be distributed around the EUV chamber 26. A portion of the microparticles 231 can be deposited on the collector mirror 30. A portion of the microparticles 232 can be captured in an optional second catch 240. The first catch 210 and second catch 240 can also be heated or cooled.

Parts, or all of the first and second catches 210, 240, may have double walls. The space between the double walls can be filled with, or designed to pass one or more heat exchange fluids, such as water, tin, gallium, tin-gallium alloy, etc., for the efficient thermal management (i.e., heating or cooling) of the catch 210, 240.

Figure 3:
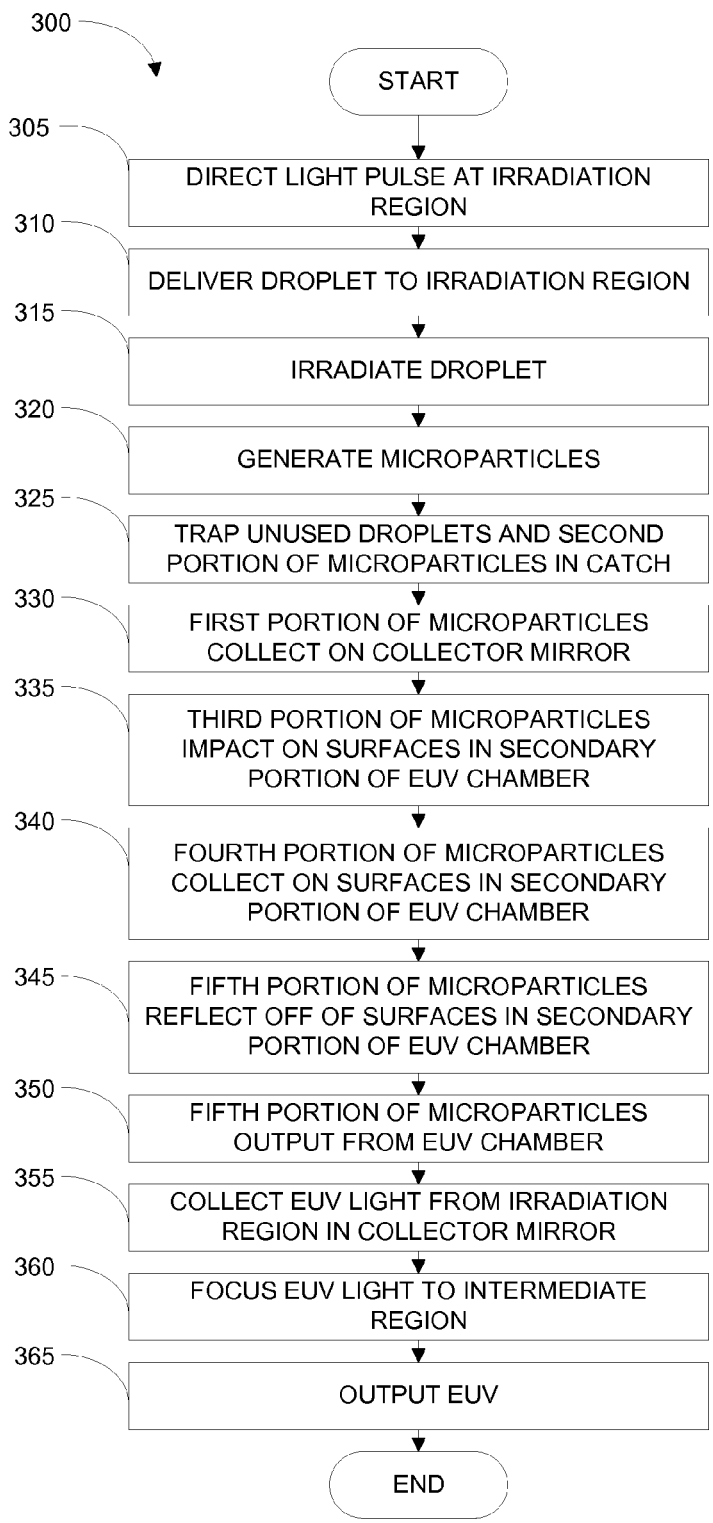
FIG. 3 is a flowchart diagram that illustrates the method operations performed in generating EUV, in accordance with embodiments of the disclosed subject matter.

FIG. 3 is a flowchart diagram that illustrates the method operations 300 performed in generating EUV 34, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 300 will now be described.

In an operation 305, a light pulse 23 is directed to the irradiation region 28 in the EUV chamber 26. In an operation 310, a selected one of a stream of droplets 102A, 102B is delivered to the irradiation region 28 at substantially the same time the light pulse 23 arrives at the irradiation region and EUV light 34 is generated from the irradiated droplet in an operation 315.

In an operation 320, a first portion of microparticles 231, a second portion of microparticles 232 and a third portion of microparticles 233 are expelled from the irradiated droplet. The first portion of the microparticles 231 are expelled out of the irradiation region 28 and toward the collector mirror 30. The second portion of the microparticles 232 are expelled out of the irradiation region 28 and toward the catches 210, 240. The third portion of the microparticles 233 are expelled out of the irradiation region 28 and toward a secondary region 235B of the EUV chamber 26. The EUV chamber 26 is divided into a primary region 235A and a secondary region 235B. The primary region 235A includes the collector mirror 30 and the irradiation region 28. The secondary region 235A includes that portion of the EUV chamber 26 between the outlet 40A and the irradiation region 28.

In an operation 325, the second portion of the microparticles 232 and the unused droplets 102C of the stream of droplets 102A, 102B are captured in the first and/or second catches 210, 240 as described above. Capturing the second portion of the microparticles 232 and the unused droplets 102C substantially limits any backsplash of microparticles and droplets 236.

In an operation 330, the first portion of the microparticles 231 collect on the collector mirror 30. In an operation 335, the third portion of the microparticles 233 impact on any surfaces in the secondary region 235B of the EUV chamber 26.

The third portion of the microparticles 233 is divided into a fourth portion 233A and a fifth portion 233B. In an operation 340, the fourth portion of the microparticles 233A impinge on and collect on the surfaces 236A in the secondary region 235B of the EUV chamber 26. The fifth portion of the microparticles 233B impinge on and reflect off the surfaces 235A in the secondary region 235B of the EUV chamber 26 in an operation 345. In an operation 350, the fifth portion of the microparticles 233B eventually escape from the EUV chamber 26 though the outlet 40A.

In an operation 355, the EUV from the irradiation region 28 is collected by the mirror collector 30. The mirror collector 30 focuses the EUV 34 to an intermediate location 40 in an operation 360 and in an operation 365, the EUV 34 is output from the EUV chamber though the outlet 40A and the method operations can end.

Figure 4:
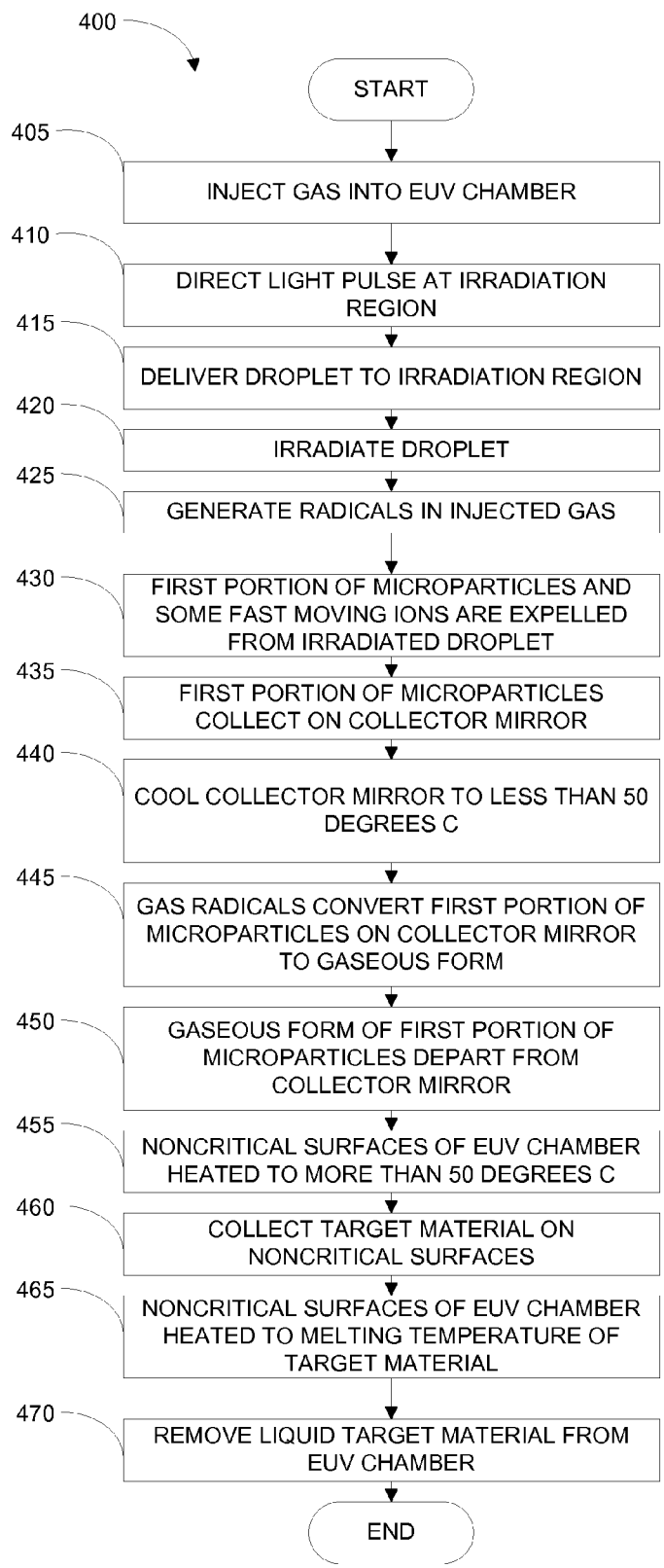
FIG. 4 is a flowchart diagram that illustrates the method operations performed in removing microparticles on the collector mirror, in accordance with embodiments of the disclosed subject matter.

FIG. 4 is a flowchart diagram that illustrates the method operations 400 performed in removing microparticles 231 on the collector mirror 30, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 400 will now be described.

In an operation 405, an etchant and/or buffer gas is introduced into the EUV chamber 26. By way of example, Argon (Ar), Helium (He) and/or Hydrogen (H) buffer gas can be included in the EUV chamber 26 to slow down or stop the fast ions and microparticles 231 emitted by the plasma so that the fast ions and microparticles 231 do not damage the collector mirror 30. Hydrogen and more particularly H radicals can be used for cleaning/etching of optical surfaces in the EUV chamber 26. The hydrogen gas pressure inside the EUV chamber can be between about 300 to about 800 mT and the gas flow into and out of the EUV chamber is between about 50 and about 100 standard liters per minute (SLM).

In an operation 410, a light pulse 23 is directed to the irradiation region 28 in the EUV chamber 26. In an operation 415, a selected one of a stream of droplets 102A, 102B is delivered to the irradiation region 28 at substantially the same time the light pulse 23 arrives at the irradiation region and a plasma is generated from the irradiated droplet in an operation 420. Irradiating the droplet generates target material residue including droplet fragments and microparticles 231, 232, 233 and fast moving ions emitted outward from the irradiation region 28.

In an operation 425, the buffer gas interacts with the plasma and the fast moving ions and the EUV light 34 photons and generates hydrogen radicals. In an operation 430, a first portion of microparticles 231 including some fast moving ions are expelled from the irradiated droplet in the irradiation region 28 and toward the collector mirror 30. In an operation 435, the first portion of microparticles 231 including some fast moving ions collects on the surface of the collector mirror 30 thereby reducing the reflectivity of the collector mirror.

In an operation 440, the collector mirror 30 is cooled to less than the temperature of the other inner surfaces of the EUV chamber. The collector mirror 30 is cooled to less about 50 degrees C. or cooler. The formation and destruction of SnH4 is related to the temperature. For higher temperatures, the formation rate slows and the destruction rate increases. Restated, tin on a hotter surface is less likely to bond with hydrogen to form SnH4 gas and SnH4 near a hot surface is more likely to breakdown (i.e., decompose) into tin and hydrogen gas to deposit tin on the hot surface and release the hydrogen as a hydrogen gas. Thus the tin removal rate decreases as the collector mirror 30 temperature increases. Conversely, as the temperature of the collector mirror 30 is reduced the removal of the deposited tin increases. Further, a higher relative temperature of the remaining inner surfaces (e.g., vessel walls and baffles) reduces tin removal from those surfaces. The differences in temperature between the cooler collector mirror 30 and the relatively hotter vessel walls lead to tin transport from the cooler collector mirror 30 to the hotter vessel walls via SnH4. Possibly more importantly, this temperature differential substantially prevents tin transport from the vessel walls to the collector mirror 30 by SnH4.

By way of example, the collector mirror 30 can include a backside cooling mechanism for cooling the backside of the collector mirror 30. The backside of the collector mirror 30 is opposite the side of the collector mirror used for collecting and reflecting the EUV light 34. The backside cooling mechanism can include a cooling jacket 30A coupled to a cooling fluid source 30B for circulating a cooling fluid through the cooling mirror jacket 30A. Alternatively or additionally, a cooling gas flow 30C can be directed from a cooled gas source 30D toward the backside of the collector mirror 30. Other suitable cooling mechanisms or combinations thereof can also be used.

In an operation 445, the hydrogen radicals react with target material deposits 231 on the surface of the collector mirror 30 and produce a hydride of the target material. By way of example if the target material is tin, the hydrogen radicals for a tin-tetrahydride ($SnH_4$). The hydride of the target material exits the surface of the collector mirror as a gas in an operation 450. The hydride reaction proceeds faster at non-elevated temperatures (e.g., less than about 50 degrees C.). The reaction for tin target material is:

$$Tin(solid) + hydrogen\ radical \gg SnH_4(gas).$$

Referring again to the example of a tin containing target material in the EUV chamber 26, the tin-tetrahydride ($SnH_4$) can absorb the EUV light 34 and can decompose on surfaces in the EUV chamber thus redepositing tin. Therefore, reducing the quantity of the hydride of the target material in the EUV chamber 26 will improve the output of the EUV light 34. In an operation 455, the non-critical surfaces in the EUV chamber 26 are maintained at a temperature higher than the temperature of the collector mirror 30 so as to promote the decomposition of the hydride of the target material and deposit the target material on the non-critical surfaces in an operation 460. The non-critical surfaces include the chamber walls 26A, 235A and other surfaces not including optical or detectors.

By way of example, the non-critical surfaces 26A, 235A can be maintained above the melting point of the target material (e.g., above about 232 degrees C. for tin target material). Maintaining the non-critical surfaces 26A, 235A above the melting point of the target material allows liquid target material to form in an optional operation 465. The liquid target material can then be removed from the non-critical surfaces 26A, 235A using gravity flow, wetting, etc. and out of the EUV chamber 26 in a target material condenser system 237, in an operation 470 and the method operations can end.

As described above in operations 345 and 350 of FIG. 3, the fifth portion of the microparticles 233B impinge on and reflect off the surfaces 235A in the secondary region 235B of the EUV chamber 26 and eventually escape from the EUV chamber 26 though the outlet 40A. When the fifth portion of the microparticles 233B escape from the EUV chamber 26 though the outlet 40A the fifth portion of the microparticles 233B can contaminate the subsequent process device 42 that uses the EUV light 34. This contamination can be exacerbated when the EUV light path 246 is in a substantially vertical orientation and especially exacerbated when the EUV light path 246 is in a substantially vertical orientation and the subsequent process device 42 is below the EUV chamber 26 such that gravity assists the travel and escape of the fifth portion of the microparticles 233B.

Figure 5A:
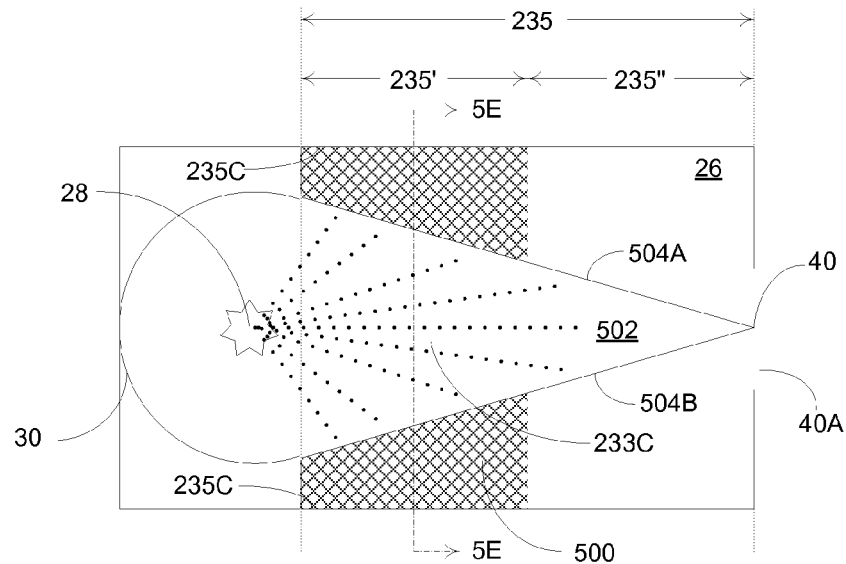
FIGS. 5A-5F illustrate a mid vessel baffle assembly in an EUV chamber, in accordance with an embodiment of the disclosed subject mater.
Figure 5B:
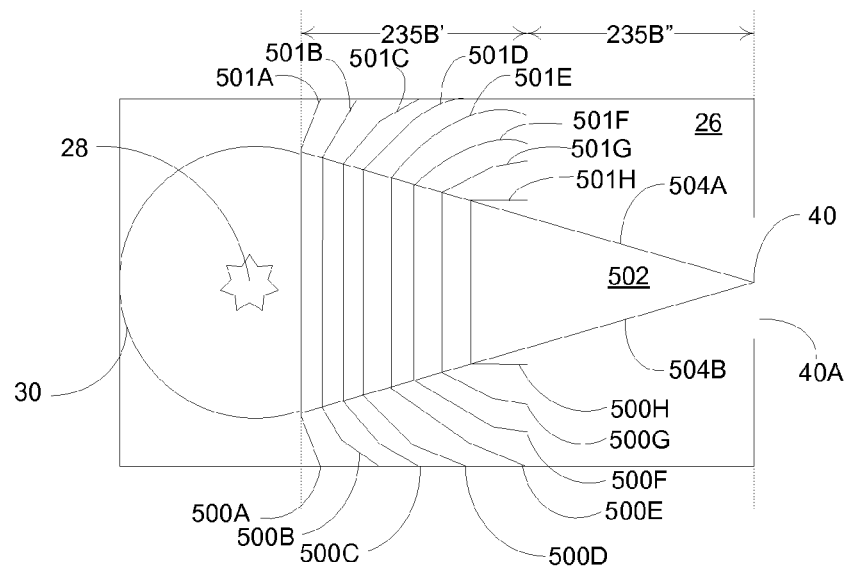
Figure 5C:
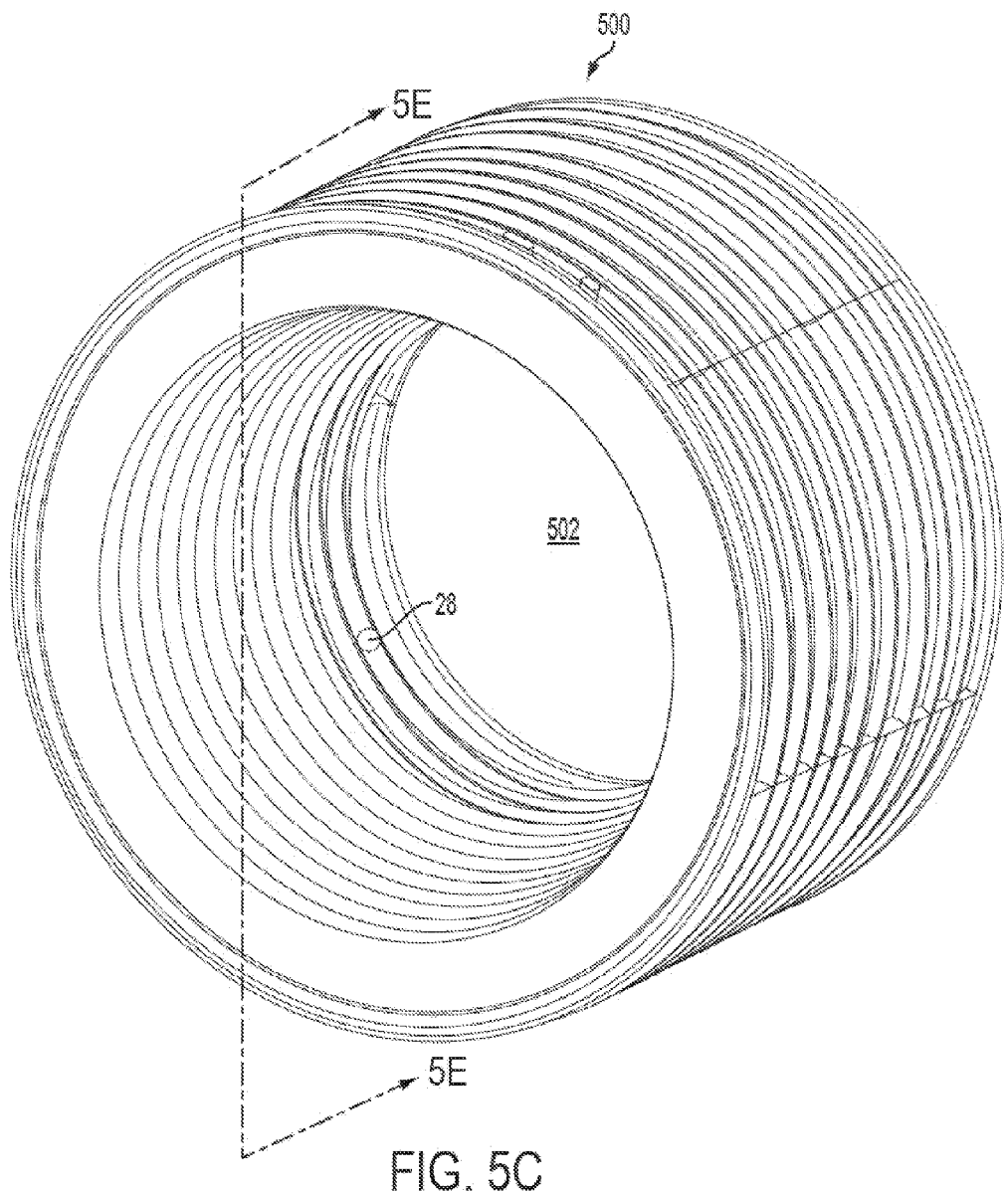
Figure 5D:
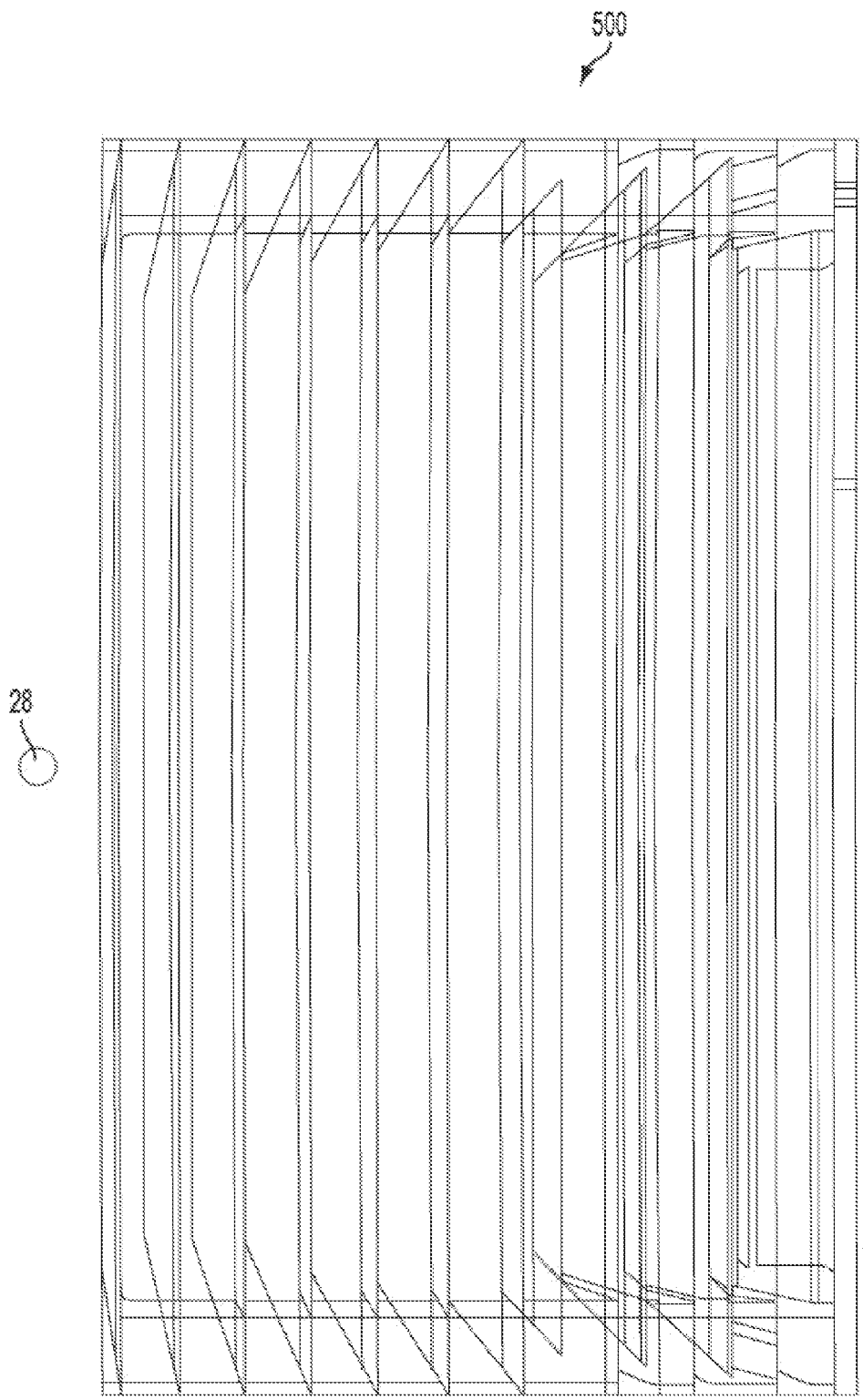
Figure 5E:
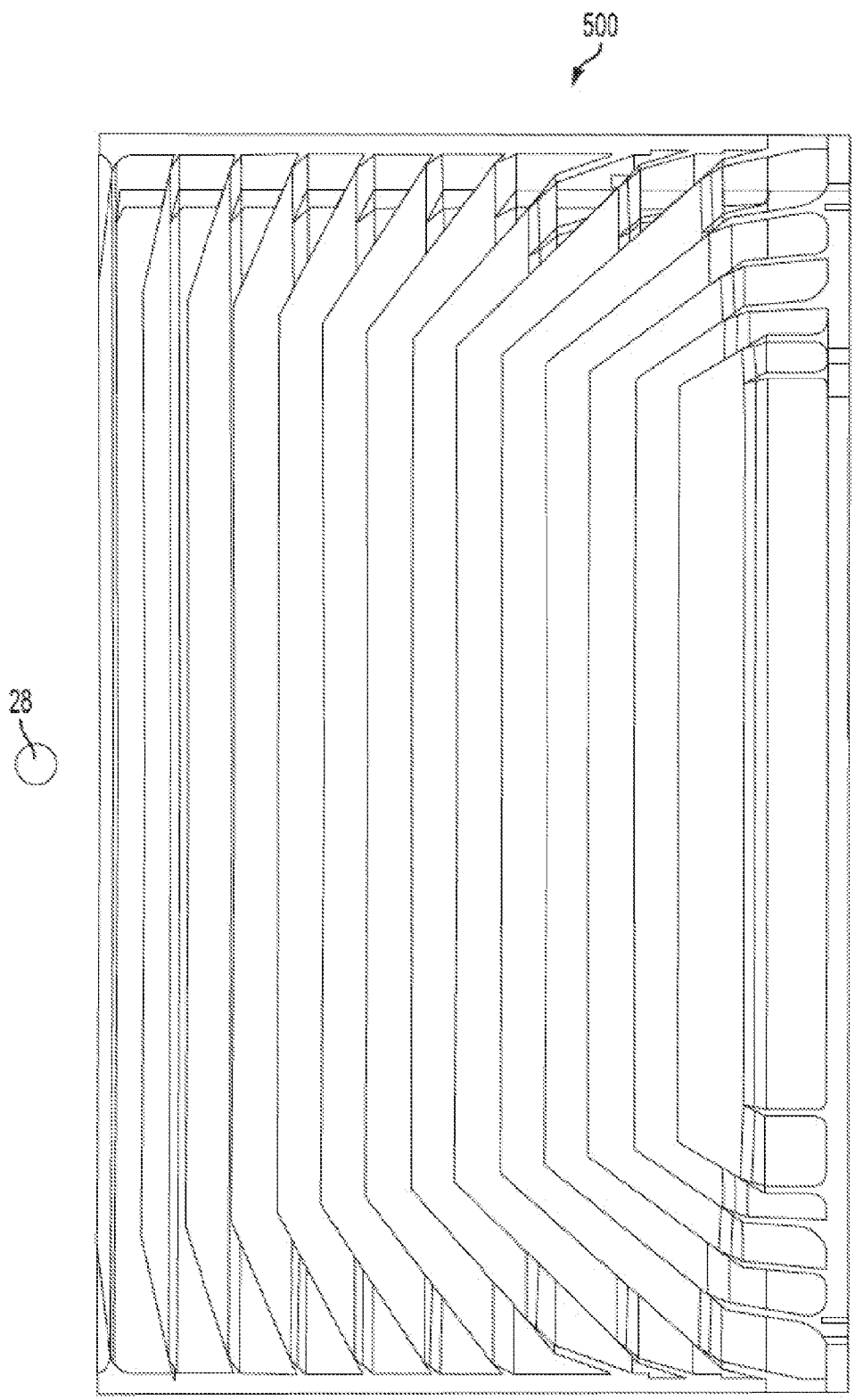
Figure 5F:
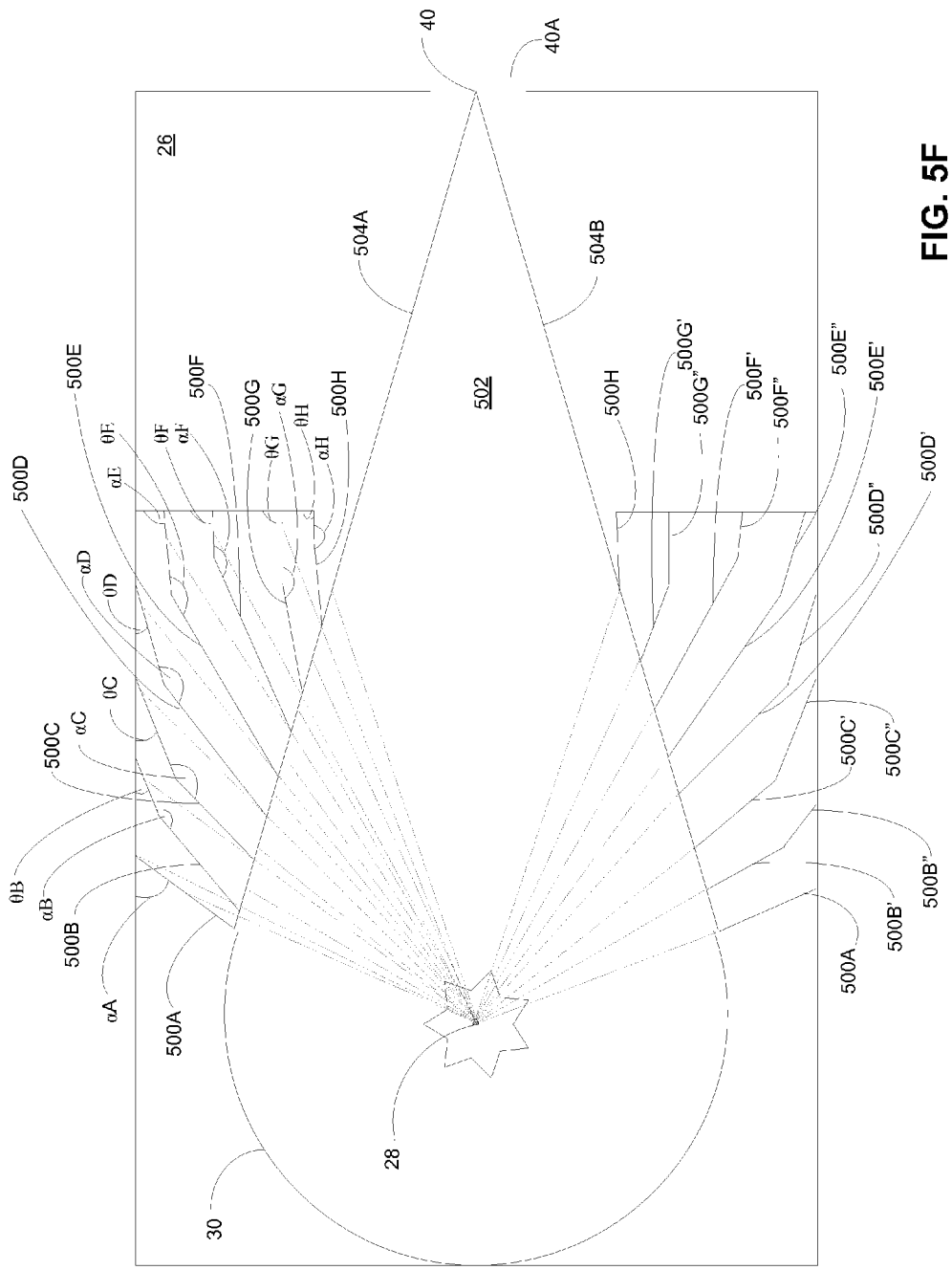

FIGS. 5A-5F illustrate a mid vessel baffle assembly 500 in an EUV chamber 26, in accordance with an embodiment of the disclosed subject matter. FIG. 5A is schematic of a side view of the mid vessel baffle assembly 500. FIG. 5B is a more detailed schematic of a side view of the mid vessel baffle assembly 500. FIG. 5C is a perspective view of the mid vessel baffle assembly 500. FIG. 5D is side view of the mid vessel baffle assembly 500. FIG. 5E is a sectional view of the mid vessel baffle assembly 500. FIG. 5F is further detailed a schematic side view of the mid vessel baffle assembly 500.

Referring first to FIG. 5A, the baffle assembly 500 is located in a mid vessel region 235' of the EUV chamber 26. The secondary region 235 of the EUV chamber 26 is divided into two portions: the mid vessel region 235' and an aft vessel region 235". The mid vessel region 235' begins at the irradiation region 28 and extends toward the outlet 40A of the EUV chamber 26. The aft vessel region 235" extends between the mid vessel region 235' and the outlet 40A of the EUV chamber 26. The mid vessel region 235' and the aft vessel region 235" have no specific length and therefore the mid vessel region 235' can include substantially all of the secondary region 235 of the EUV chamber 26.

The baffle assembly 500 includes a series of passages and structures (described in more detail below) that receive, slow and capture substantially all of the third portion of the microparticles 233 created when a droplet is irradiated in the irradiation region 28. The baffle assembly 500 can extend from the irradiation region 28 and the collector mirror 30 to the intermediate location 40 or any portion of the secondary region 235 of the EUV chamber 26. While the baffle assembly 500 can extend from the irradiation region 28 and the collector mirror 30 to the intermediate location 40, the baffle assembly does not prevent or otherwise occlude the EUV light 34 from passing from the collector mirror 30 through a three dimensional, cone-shaped transmissive region 502 to the intermediate location 40.

The passages in the baffle assembly 500 begin at the edges 504A, 504B of the transmissive region 502 and the passages in the baffle assembly 500 extend to the inner surfaces 235C of the EUV chamber 26. Exemplary embodiments of the passages and the structures that form them in the baffle assembly 500 are described in more detail below. Referring to FIG. 5C, the baffle assembly 500 is shown in a three dimensional pictorial view. The baffle assembly 500 is a series of concentric baffles 500A-500H surrounding but not protruding into the transmissive region 502. The baffle assembly 500 extends substantially from the edges 504A, 504B of the transmissive region 502 to the inner surfaces 235C of the chamber.

Referring to FIGS. 5B and 5F, the baffle assembly 500 is shown in a side view illustrating the series of concentric baffles 500A-500H. A first portion of the baffles 500A, 500H are single step baffles and a second portion of the baffles 500B-500G are multiple step baffles. The single step baffles 500A, 500H have an initial corresponding baffle angle $\alpha A$, $\alpha H$ that is the same between the ends of the baffle assembly 500, near the edges 504A, 504B of the transmissive region 502 and the inner surfaces 235C of the EUV chamber 26. The initial corresponding baffle angle $\alpha A$, $\alpha H$ can substantially align the single step baffles 500A, 500H with the irradiation region 28.

The single step baffles 500A are angled such that their attachment point to the wall 235C of the EUV chamber is aligned with a shadow formed by a first section of the adjacent baffle. Such an angle substantially prevents any direct line exposure of the wall by droplet fragments coming directly from the irradiation region 28. The droplet fragments (e.g., microparticles) therefore must first strike the first step in the baffle, thus losing energy, before reaching the wall 235C. Reducing the energy by deflecting the droplet fragments off at least one surface of a baffle before the droplet fragments impact the EUV chamber wall 235C reduces the possibility that the droplet fragment will deflect off of the EUV chamber wall and back toward the collector mirror 30. Further, any back deflection of the droplet fragment must then also bounce at least once off a baffle surface before reaching the collector mirror 30, thus further reducing the energy and increasing the likelihood that the droplet fragment will stick to the surface of the baffles 500A-500G and not return to the collector mirror 30

The multiple step baffles 500B-500G have multiple corresponding baffle angles $\alpha B$-$\alpha G$ and $\theta B$-$\theta G$ such that the angle of the multiple step baffles changes between the edges 504A, 504B of the transmissive region 502 and the inner surfaces 235C of the EUV chamber 26. The corresponding initial baffle angle $\alpha B$-$\alpha G$ can be substantially align a corresponding first portion 500B'-500G' of the baffles 500A-500H with the irradiation region 28, as shown by the phantom lines extending from the irradiation region toward each of the baffles 500A-500G. The corresponding second baffle angle θB-θG angles a corresponding second portion 500B"-500G" of the baffles 500A-500H away from the irradiation region 28 so as to promote reflection and capture of microparticles 233 emitted from the irradiation region.

It should be understood that while the baffles 500A-500H are shown as being straight and even multiple straight portions, a curved baffle 501D-501H as shown in FIG. 5B could be used. The curvature of the curved baffles 501D-501H can vary between the edges 504A, 504B of the transmissive region 502 and the inner surfaces 235C of the EUV chamber 26. At least an initial portion of the curved baffles 501A-501H can be substantially aligned with the irradiation region 28. A combination of curved and straight portions of the baffles could be used or a combination of straight and/or curved and/or multiple step baffles could be included in the baffle assembly 500. The baffles 500A-500H can be substantially evenly spaced as shown in FIGS. 5C and 5E or unevenly spaced as shown in FIGS. 5B and 5F.

One or more portions and/or one or more of the baffles 500A-500H can be heated or cooled as may be desired to improve the capture of the microparticles 233 emitted from the irradiation region 28. The different portions of the baffles 500A-500H can be manufactured of different materials as may be desired for manufacturability, performance and durability or other reasons. By way of example the baffles 500A-500H can be manufactured from one or more of molybdenum, stainless steel (e.g., SS-304, 316, Titanium, nickel, Copper or Aluminum or similar materials).

The baffle assembly 500 can also include holes or spaces or portions of selected baffles removed to provide access for diagnostics detectors (e.g., EUV detectors), one or more pinhole cameras, vacuum periscope, droplet imagining and detection and steering, target material catch, vacuum ports, windows and any other access needed for the access, design, construction and operation of the EUV chamber 26.

Figure 7:
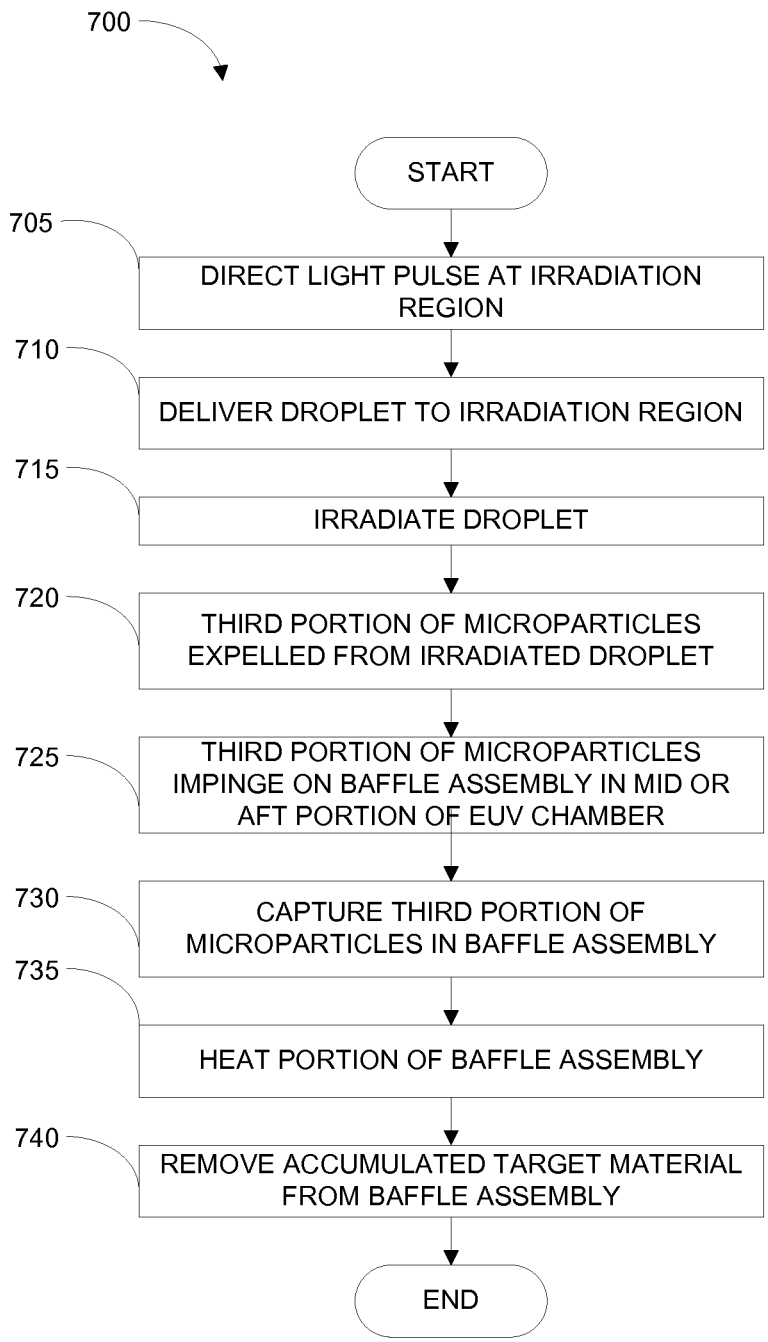
FIG. 7 is a flowchart diagram that illustrates the method operations performed in capturing and removing the third portion of the microparticles in the baffle assembly, in accordance with embodiments of the disclosed subject matter.

FIG. 6 illustrates a mid vessel baffle assembly 500 in an EUV chamber 26, in accordance with an embodiment of the disclosed subject mater. FIG. 7 is a flowchart diagram that illustrates the method operations 700 performed in capturing and removing the third portion of the microparticles 233C in the baffle assembly 500, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 700 will now be described.

In an operation 705, a light pulse 23 is directed to the irradiation region 28 in the EUV chamber 26. In an operation 710, a selected one of a stream of droplets 102A, 102B is delivered to the irradiation region 28 at substantially the same time the light pulse 23 arrives at the irradiation region and a plasma is generated from the irradiated droplet in an operation 715.

In an operation 720, the third portion of microparticles 233 (as described in FIGS. 2B and 5A above) are emitted from the irradiation region 28 toward the baffle assembly 500. The third portion of microparticles 233 impinge on the baffle 500D" and reflect at point 602 toward the baffle 500E", in an operation 725. In an operation 730, the third portion of microparticles 233 are captured in the baffle assembly 500 as the microparticles 233 reflect off point 604 and come to rest in the space 605 between the baffle 500D" and baffle 500E".

In an optional operation 735, a portion of the baffle assembly 500 and/or the EUV chamber can be heated. The portion of the baffle assembly 500 and/or the EUV chamber can be heated such as with a heater 622. The heater 622 can be any suitable heater by way of example the heater 622 can be a resistive heater or a double wall jacket type heater or combinations thereof. The heater 622 can be coupled to a heater control/source 626 that can provide an electrical current to a resistive heater 622 or a heated medium to circulate through the double jacketed heater 622.

In an operation 740, the accumulated microparticles 610 can be removed to a target material condenser system 237. Removing the accumulated microparticles 610 can include heating the accumulated microparticles 610 to a melting temperature and removing the accumulated microparticles 610 in liquid form. The target material condenser system 237 can also include a vacuum source to draw the accumulated microparticles 610 in solid or liquid form into the target material condenser system 237 through a withdrawal port 620.

Figure 8:
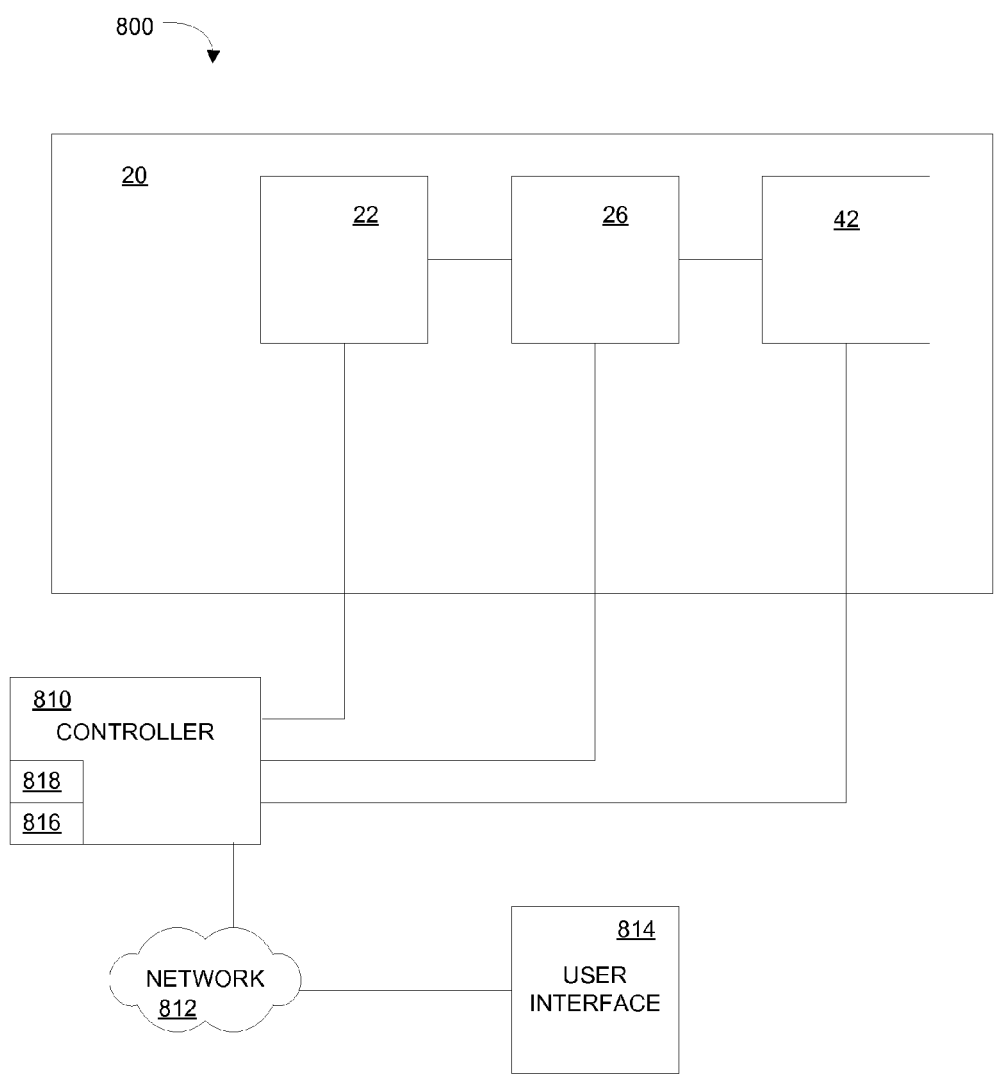
FIG. 8 is a block diagram of an integrated system including the EUV chamber, in accordance with embodiments of the disclosed subject matter.

FIG. 8 is a block diagram of an integrated system 800 including the EUV chamber 26, in accordance with embodiments of the disclosed subject matter. The integrated system 800 includes the EUV chamber 26, the light pulse generation system 22, the device 42 utilizing output EUV light 34, and an integrated system controller 810 coupled to the EUV chamber, the light pulse generation system and the device utilizing output EUV light. The integrated system controller 810 includes or is coupled to (e.g., via a wired or wireless network 812) a user interface 814. The user interface 814 provides user readable outputs and indications and can receive user inputs and provides user access to the integrated system controller 810.

The integrated system controller 810 can include a special purpose computer or a general purpose computer. The integrated system controller 810 can execute computer programs 816 to monitor, control and collect and store data 818 (e.g., performance history, analysis of performance or defects, operator logs, and history, etc.) for the EUV chamber 26, the light pulse generation system 22 and the device 42. By way of example, the integrated system controller 810 can adjust the operations of the EUV chamber 26, the light pulse generation system 22 and/or the device 42 and/or the components therein (e.g., the first catch 210 and/or second catch 240, target material dispenser 92, baffle assembly 500, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A chamber comprising:
a first surface disposed within the chamber;
a cooling system coupled to operative to maintain the first surface to less than a melting temperature of a target material;
a target material dispenser system containing a quantity of the target material, the target material dispenser capable of flowing the target material to an irradiation region in the chamber, a first portion of the target material being deposited on at least a portion of the first surface;
a hydrogen containing gas source coupled to the chamber; and
a hydrogen radical generator including a target material plasma capable of being formed by irradiating the target material at the irradiation region, the target material plasma capable of generating hydrogen radicals from the hydrogen containing gas source, the hydrogen radicals being capable of reacting with the first portion of target material deposited on the first surface to form a volatile hydride of the target material.

2. The chamber of claim 1, wherein irradiating the target material at the irradiation region includes irradiating the target material with at least one light pulse.

3. The chamber of claim 1, wherein hydrogen radical generator includes the target material plasma and an EUV light source, wherein the hydrogen containing gas interacts with the target material plasma and EUV light photons to generate hydrogen radicals.

4. The chamber of claim 1, wherein the first surface disposed within the chamber includes a light reflective surface.

5. The chamber of claim 1, further comprising an inner surface of at least one wall of the chamber.

6. The chamber of claim 1, further comprising a second surface including at least a first portion of a plurality of baffles disposed within the chamber.

7. The chamber of claim 6, wherein each of the plurality of baffles being in contact with an inner surface of the chamber.

8. The chamber of claim 6, wherein the plurality of baffles disposed within the chamber are disposed proximate to an outlet of the chamber.

9. The chamber of claim 6, wherein the first portion of the plurality of baffles begin at an edge of a transmissive region.

10. The chamber of claim 1, further comprising a heat source coupled to a third surface disposed within the chamber, wherein the heat source is capable of heating the third surface without heating the first surface.

11. The chamber of claim 10, wherein the heat source is capable of heating at least a portion of the third surface to a temperature greater than the first surface without heating the first surface.

12. The chamber of claim 10, wherein the heat source is capable of heating at least a portion of the third surface to at least a melting temperature of a target material.

13. A chamber comprising:
a light reflective first surface disposed within the chamber;
a cooling system coupled to operative to maintain the first surface to less than a melting temperature of a target material;
a target material dispenser system containing a quantity of the target material, the target material dispenser capable of flowing the target material to an irradiation region in the chamber, a first portion of the target material being deposited on at least a portion of the first surface;
a hydrogen containing gas source coupled to the chamber;
a hydrogen radical generator including a target material plasma capable of being formed by irradiating the target material at the irradiation region, the target material plasma capable of generating hydrogen radicals from the hydrogen containing gas source, the hydrogen radicals being capable of reacting with the first portion of target material deposited on the first surface to form a volatile hydride of the target material; and
a heat source coupled to a second surface disposed within the chamber, wherein the heat source is capable of heating the second surface without heating the first surface.

14. A method of removing residue from a surface comprising:
maintaining a first surface to less than a melting temperature of a target material the first surface being disposed within a chamber;
flowing the target material to an irradiation region in the chamber;
irradiating the target material at the irradiation region to form a target material plasma;
depositing a first quantity of the target material on the first surface;
injecting a hydrogen containing gas into the chamber;
generating hydrogen radicals from the hydrogen containing gas within the chamber, wherein the target material plasma generates the hydrogen radicals;
converting a first portion of the first quantity of target material on the first surface to a hydride, wherein the hydrogen radicals react with the first portion of the first quantity of target material to form the hydride; and evaporating the hydride of the first portion of the first quantity of target material residue from the first surface; and removing the evaporated hydride of the first portion of the first quantity of target material residue from the chamber.

15. The method of claim 14, further comprising collecting a second quantity of target material residue on at least a second portion of a plurality of baffles disposed within the chamber.

16. The method of claim 15, further comprising heating a second portion of the plurality of baffles to a melting temperature of the second quantity of target material residue without heating the first surface.

17. The method of claim 16, further comprising capturing the melted second quantity of target material residue in a target material condenser system.

18. The method of claim 14, wherein removing the evaporated hydride of the first quantity of target material residue from the chamber includes decomposing the evaporated hydride on a plurality of non-critical inner surfaces of the chamber.

19. The method of claim 14, further comprising heating a plurality of non-critical inner surfaces of the chamber to a temperature equal to or greater than a melting temperature of the target material residue, the plurality of non-critical inner surfaces of the chamber include surfaces other than the first surface.

\* \* \* \* \*